(12) United States Patent
Lin et al.

(10) Patent No.: US 10,976,787 B2
(45) Date of Patent: Apr. 13, 2021

(54) EXTERNAL LIQUID COOLING DEVICE

(71) Applicant: COOLER MASTER CO., LTD., New Taipei (TW)

(72) Inventors: Chien-Liang Lin, New Taipei (TW); Wen-Hsien Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 88 days.

(21) Appl. No.: 16/255,597

(22) Filed: Jan. 23, 2019

(65) Prior Publication Data
US 2020/0166976 A1 May 28, 2020

(30) Foreign Application Priority Data
Nov. 22, 2018 (TW) ................................ 107215847

(51) Int. Cl.
*G06F 1/20* (2006.01)
*H05K 7/20* (2006.01)

(52) U.S. Cl.
CPC ......... *G06F 1/203* (2013.01); *H05K 7/20154* (2013.01); *H05K 7/20272* (2013.01)

(58) Field of Classification Search
CPC ......... H01L 23/46; H01L 23/473; H05K 7/20; H05K 7/20154; H05K 7/20272; H05K 7/20327; H05K 7/20218; H05K 7/20263; G06F 1/20; G06F 1/203
USPC ..... 165/104.19, 104.33; 361/679.01, 679.47, 361/679.48, 696, 697, 701, 702, 703, 704
See application file for complete search history.

(56) References Cited

U.S. PATENT DOCUMENTS

| | | | |
|---|---|---|---|
| 7,021,367 B2* | 4/2006 | Oikawa | F28D 15/02 165/185 |
| 8,631,860 B2* | 1/2014 | Tang | G06F 1/20 123/41.51 |
| 9,818,671 B2* | 11/2017 | Huang | G06F 1/20 |
| 9,907,207 B1* | 2/2018 | Wu | H05K 7/20272 |
| 10,015,909 B1* | 7/2018 | Han | G06F 1/20 |
| 10,048,008 B1* | 8/2018 | Mounioloux | F28D 1/05391 |
| 10,375,856 B2* | 8/2019 | Tsai | H01L 23/473 |
| 10,593,611 B2* | 3/2020 | Tsai | H01L 23/467 |
| 2008/0087024 A1* | 4/2008 | Hood | H01L 35/30 62/3.2 |
| 2008/0105407 A1* | 5/2008 | Yeh | H01L 23/467 165/104.28 |
| 2009/0044929 A1* | 2/2009 | Yeh | H01L 23/473 165/104.19 |
| 2010/0259888 A1* | 10/2010 | Pomytkin | H01L 23/36 361/679.47 |
| 2011/0000649 A1* | 1/2011 | Joshi | H01L 23/467 165/104.26 |

(Continued)

*Primary Examiner* — Len Tran
*Assistant Examiner* — Gustavo A Hincapie Serna
(74) *Attorney, Agent, or Firm* — Maschoff Brennan

(57) ABSTRACT

This disclosure relates to an external liquid cooling device including at least one radiator, at least one airflow generator, a water block and a mount head module. The at least one airflow generator and the water block are respectively disposed at two adjacent sides of the at least one radiator. The mount head module includes two connectors which are respectively connected to the at least one radiator and the water block via piping. The mount head module and the water block are respectively located at two opposite sides of the at least one radiator.

7 Claims, 6 Drawing Sheets

(56) References Cited

U.S. PATENT DOCUMENTS

| | | | |
|---|---|---|---|
| 2011/0100612 A1* | 5/2011 | Tang | F28D 15/0266 |
| | | | 165/104.33 |
| 2014/0009884 A1* | 1/2014 | Chen | H01L 23/427 |
| | | | 361/697 |
| 2017/0115708 A1* | 4/2017 | Tivadar | G06F 1/20 |
| 2017/0359920 A1* | 12/2017 | Huang | H01L 23/473 |
| 2018/0172365 A1* | 6/2018 | Tsai | H05K 7/20263 |
| 2018/0308786 A1* | 10/2018 | Huang | F28D 1/0535 |
| 2019/0074239 A1* | 3/2019 | Franz | H01L 23/4093 |
| 2020/0042052 A1* | 2/2020 | Shabbir | G06F 1/206 |

* cited by examiner

EXTERNAL LIQUID COOLING DEVICE

CROSS-REFERENCE TO RELATED APPLICATIONS

This non-provisional application claims priority under 35 U.S.C. § 119(a) on Patent Application No(s). 107215847 filed in Taiwan, R.O.C. on Nov. 22, 2018, the entire contents of which are hereby incorporated by reference.

Technical Field

The present disclosure relates to a liquid cooling device, more particularly to an external liquid cooling device.

Background

A laptop, also called a notebook computer, is smaller, lighter, and portable compared to desktop computers. These reasons make the notebook computer more popular than the desktop computer. As the notebook computer develops, the internal components are designed to be more compact and to generate more heat than ever, such that the internal space for heat dissipation is very limited and the heat is difficult to be removed. As a result, the internal heat dissipation device, such as fan, is unable to effectively cool down the notebook computer. Therefore, some manufacturers start to develop external heat dissipation device, such as an external liquid cooling device.

However, the conventional external liquid cooling device is large in size and thus not easy to carry around. In the contrast, the notebook computer without using the external liquid cooling device may difficult to remove the heat.

SUMMARY

The present disclosure provides an external liquid cooling device that not only can cool the notebook computer but also has an easily-portable size.

According to one aspect of the present disclosure, an external liquid cooling device includes at least one radiator, at least one airflow generator, a water block and a mount head module. The at least one airflow generator and the water block are respectively disposed at two adjacent sides of the at least one radiator. The mount head module includes two connectors which are connected to the at least one radiator and the water block via piping. The mount head module and the water block are respectively located at two opposite sides of the at least one radiator.

According to the external liquid cooling device discussed above, the water block and the mount head module are respectively disposed at two opposite sides of the radiator. Therefore, the external liquid cooling device has a smaller volume. Accordingly, the external liquid cooling device not only can cool the notebook computer but also has an easily-portable size.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
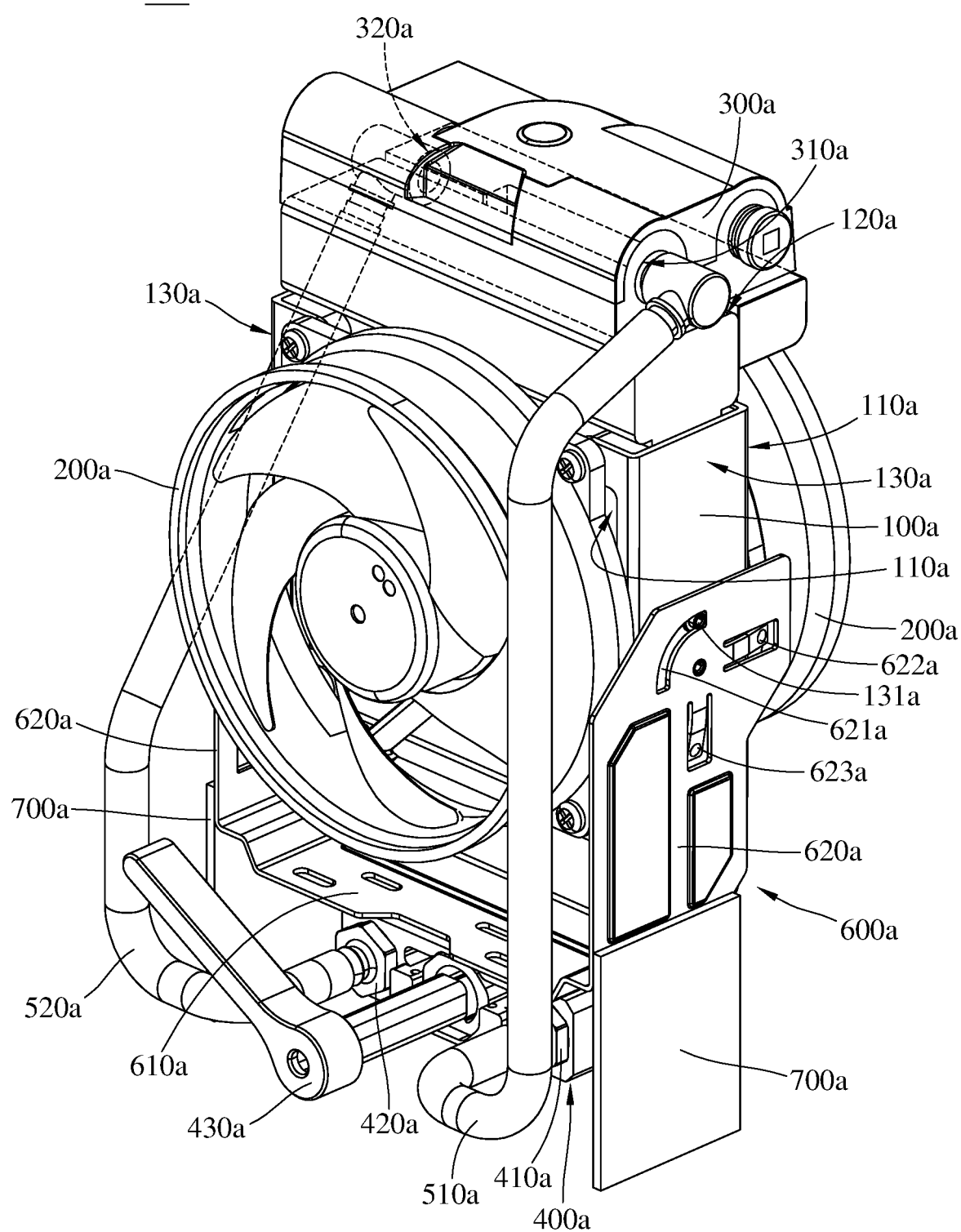
FIG. 1 is a perspective view of an external liquid cooling device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
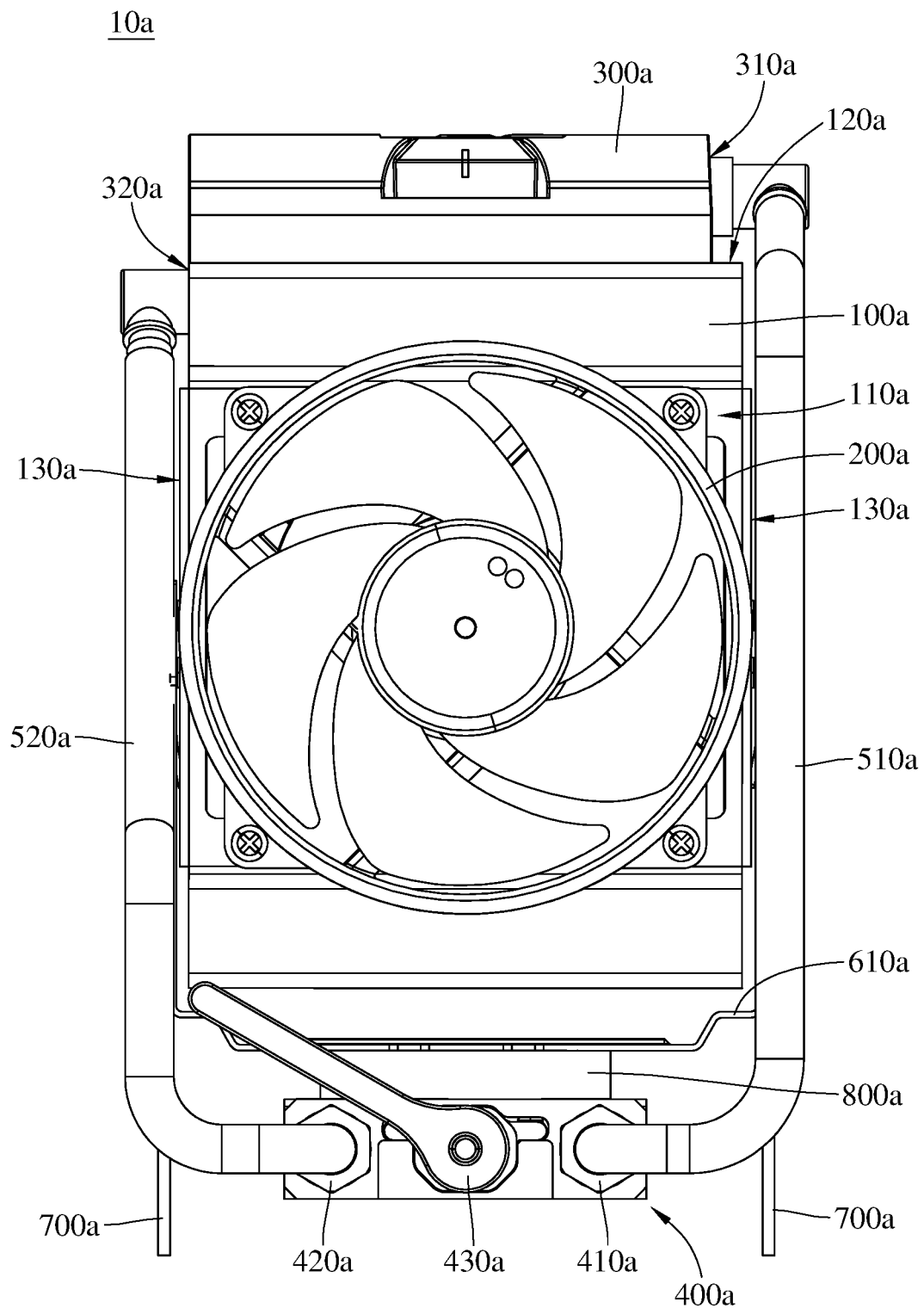
FIG. 2 is a front view of the external liquid cooling device in FIG. 1.
Figure 3:
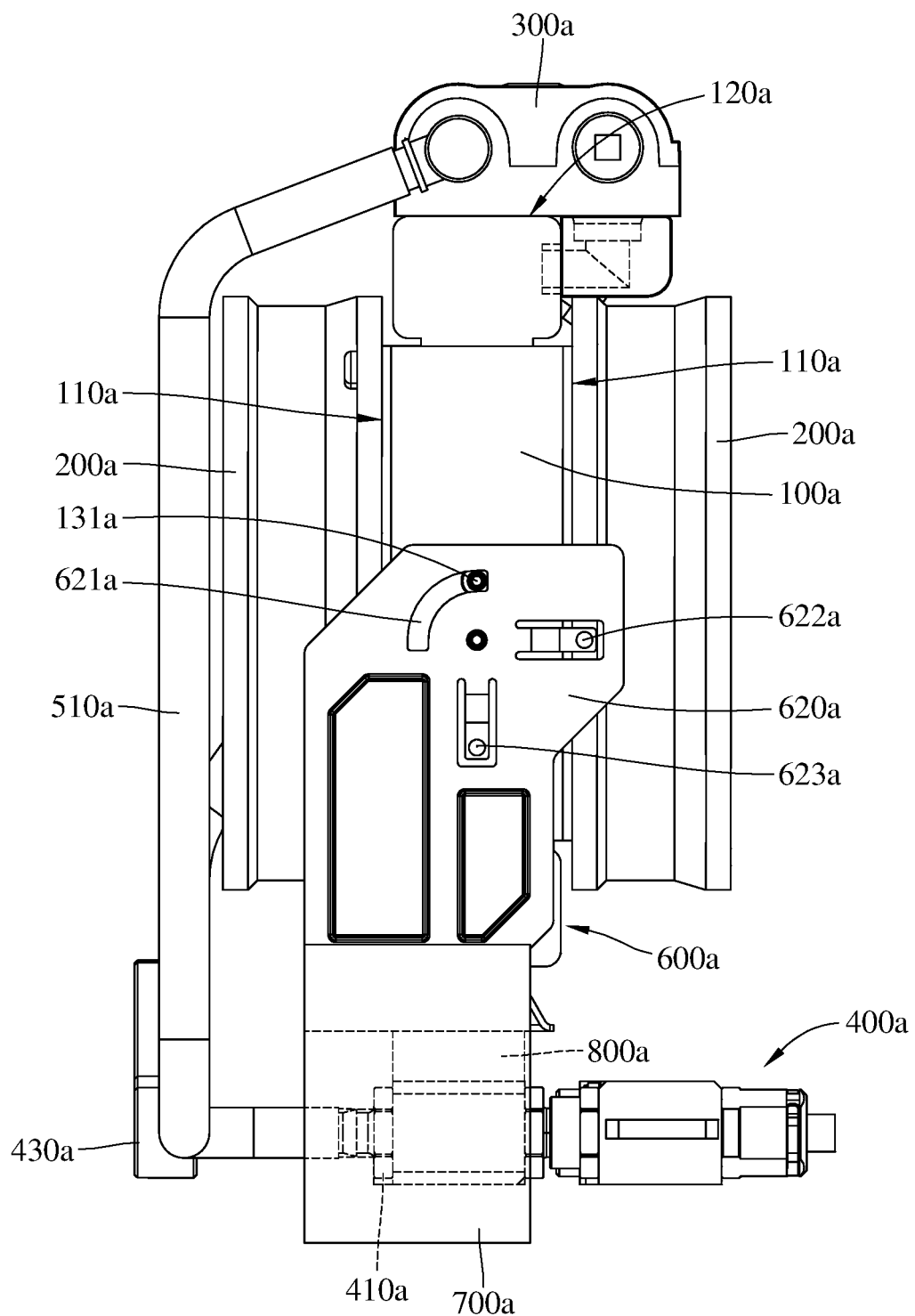
FIG. 3 is a side view of the external liquid cooling device in FIG. 1.

Please refer to FIG. 1 to FIG. 3, FIG. 1 is a perspective view of an external liquid cooling device according to a first embodiment of the present disclosure, FIG. 2 is a front view of the external liquid cooling device in FIG. 1, and FIG. 3 is a side view of the external liquid cooling device in FIG. 1.

This embodiment provides an external liquid cooling device 10a. The external liquid cooling device 10a may be a portable electronic device configured for cooling a notebook computer. The external liquid cooling device 10a includes a radiator 100a, two airflow generators 200a, a water block 300a and a mount head module 400a.

The radiator 100a has two heat dissipation surfaces 110a opposite to each other, a first contact surface 120a and two second contact surfaces 130a opposite to each other. The two heat dissipation surfaces 110a are connected to and located between the two second contact surfaces 130a. The first contact surface 120a and the two second contact surfaces 130a are located at different sides of the radiator 100a.

Each of the airflow generators 200a is, for example, an axial fan, and the radiator 100a is located between the airflow generators 200a. The airflow generators 200a can respectively generate airflow to the heat dissipation surfaces 110a of the radiator 100a so as to dissipate the heat from the radiator 100a.

The water block 300a is disposed on the first contact surface 120a of the radiator 100a. That is, the water block 300a and the airflow generators 200a are respectively disposed on different sides of the radiator 100a.

The mount head module 400a is located at a side of the radiator 100a away from the water block 300a. That is, the mount head module 400a and the water block 300a are respectively located at two opposite sides of the radiator 100a.

In addition, the mount head module 400a includes two connectors 410a and 420a which are connected to the water block 300a and the radiator 100a via piping. In detail, the water block 300a may further have an inlet 310a and an outlet 320a, the external liquid cooling device 10a may further include two pipes 510a and 520a, and the connectors 410a and 420a are respectively connected to the inlet 310a and the outlet 320a of the water block 300a via the pipes 510a and 520a.

In this embodiment, the external liquid cooling device 10a may further include a frame 600a, two support components 700a and an elastic component 800a. The frame 600a may further include a connecting component 610a and two engaging components 620a. The connecting component 610a is connected to and located between the two engaging components 620a. The engaging components 620a are respectively connected to the second contact surfaces 130a of the radiator 100a, and the radiator 100a is pivotable with respect to the frame 600a. In more detail, each of the engaging components 620a may further have a groove 621a, and the radiator 100a may further include two guide pins 131a. The guide pins 131a are respectively slidably located at the grooves 621a so that the radiator 100a is pivotably disposed on the frame 600a. As such, the radiator 100a is able to be in an incline manner with respect to the frame 600a. Furthermore, each engaging component 620a may further have a plurality of positioning components 622a and 623a configured to position the radiator 100a on the two engaging components 620a. Specifically, in this embodiment, the positioning components 622a are configured to position the radiator 100a in a horizontal manner, and the positioning components 623a are configured to position the radiator 100a in a vertical manner.

The support components 700a are respectively disposed on the engaging components 620a and protrude from a side of the connecting component 610a away from the radiator 100a. The mount head module 400a is disposed at a side of the connecting component 610a away from the radiator 100a via the elastic component 800a and is located between the support components 700a.

In this embodiment, the mount head module 400a may further include an auxiliary component 430a configured to assist in connecting the connectors 410a and 420a to another two connectors (not shown in figures) of a notebook computer (not shown in figures). The elastic component 800a is configured to be compressed so that the two connectors 410a and 420a of the external liquid cooling device 10a is able to be aligned to the two connectors of the notebook computer; thus the two connectors 410a and 420a of the external liquid cooling device 10a is convenient for connecting to the two connectors of the notebook computer.

The water block 300a and the mount head module 400a are respectively disposed at two opposite sides of the radiator 100a. Therefore, the external liquid cooling device 10a has a smaller volume. Accordingly, the external liquid cooling device 10a not only can cool the notebook computer but also is easily portable.

Figure 4:
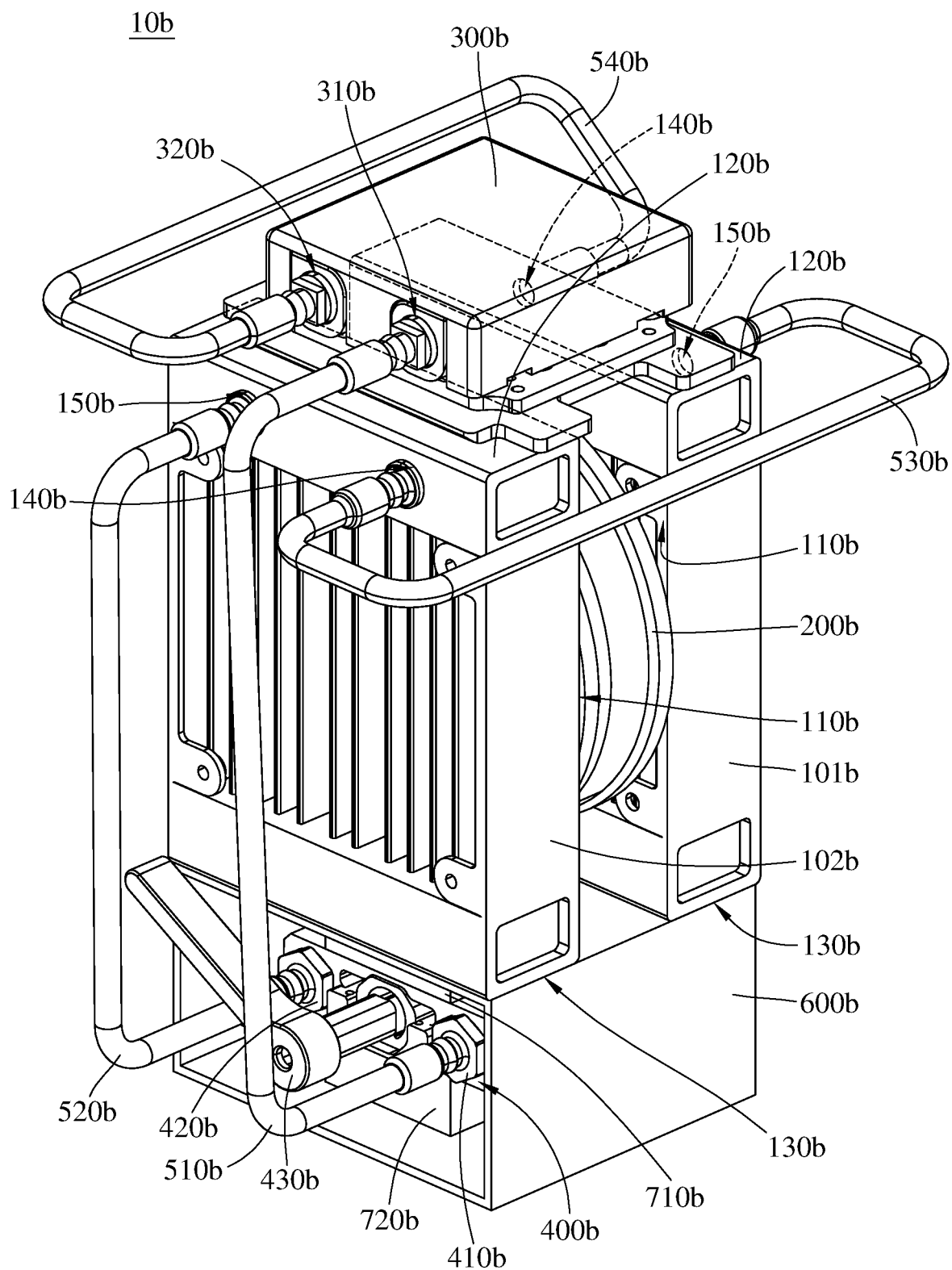
FIG. 4 is a perspective view of an external liquid cooling device according to a second embodiment of the present disclosure.
Figure 5:
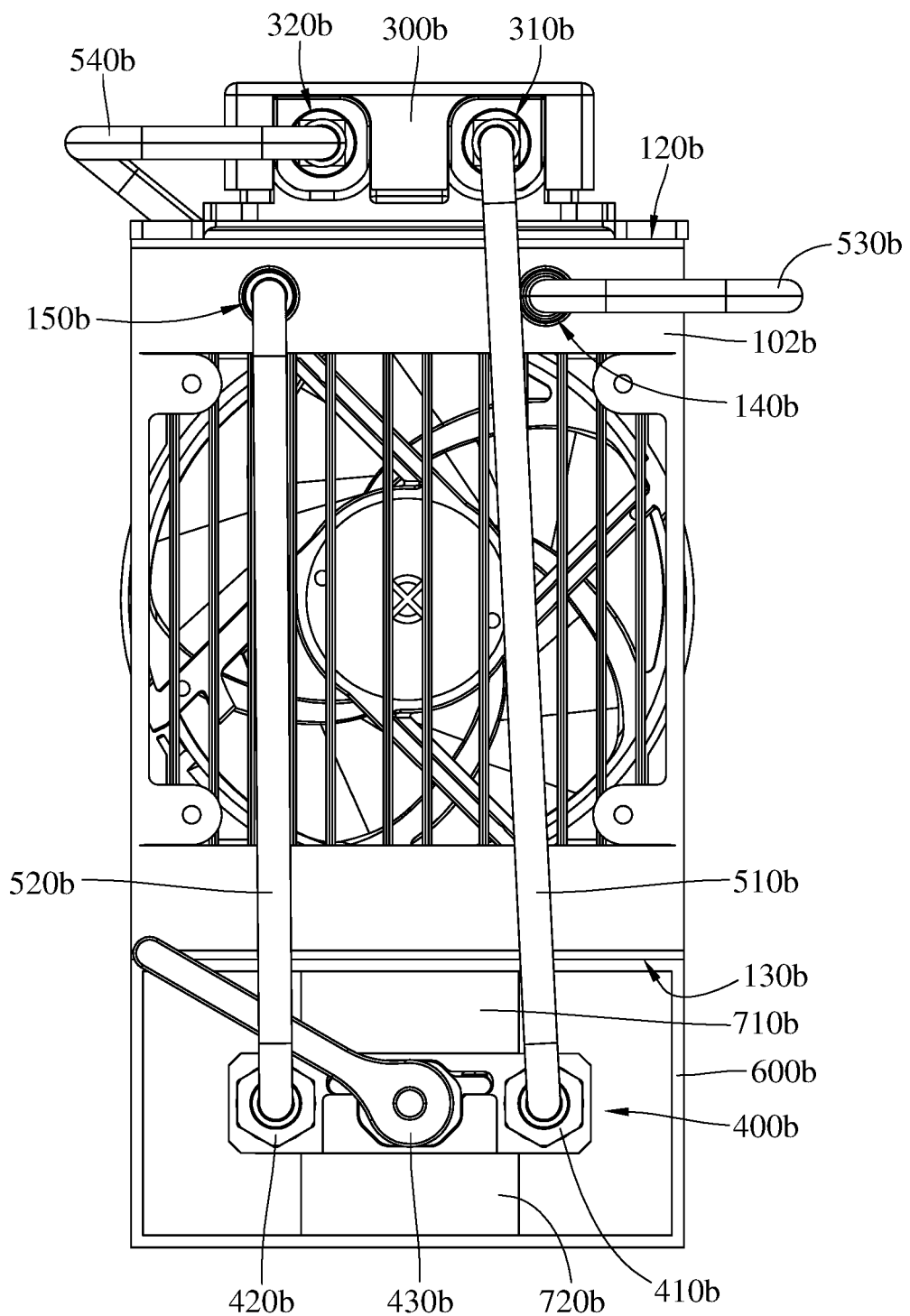
FIG. 5 is a front view of the external liquid cooling device in FIG. 4.
Figure 6:
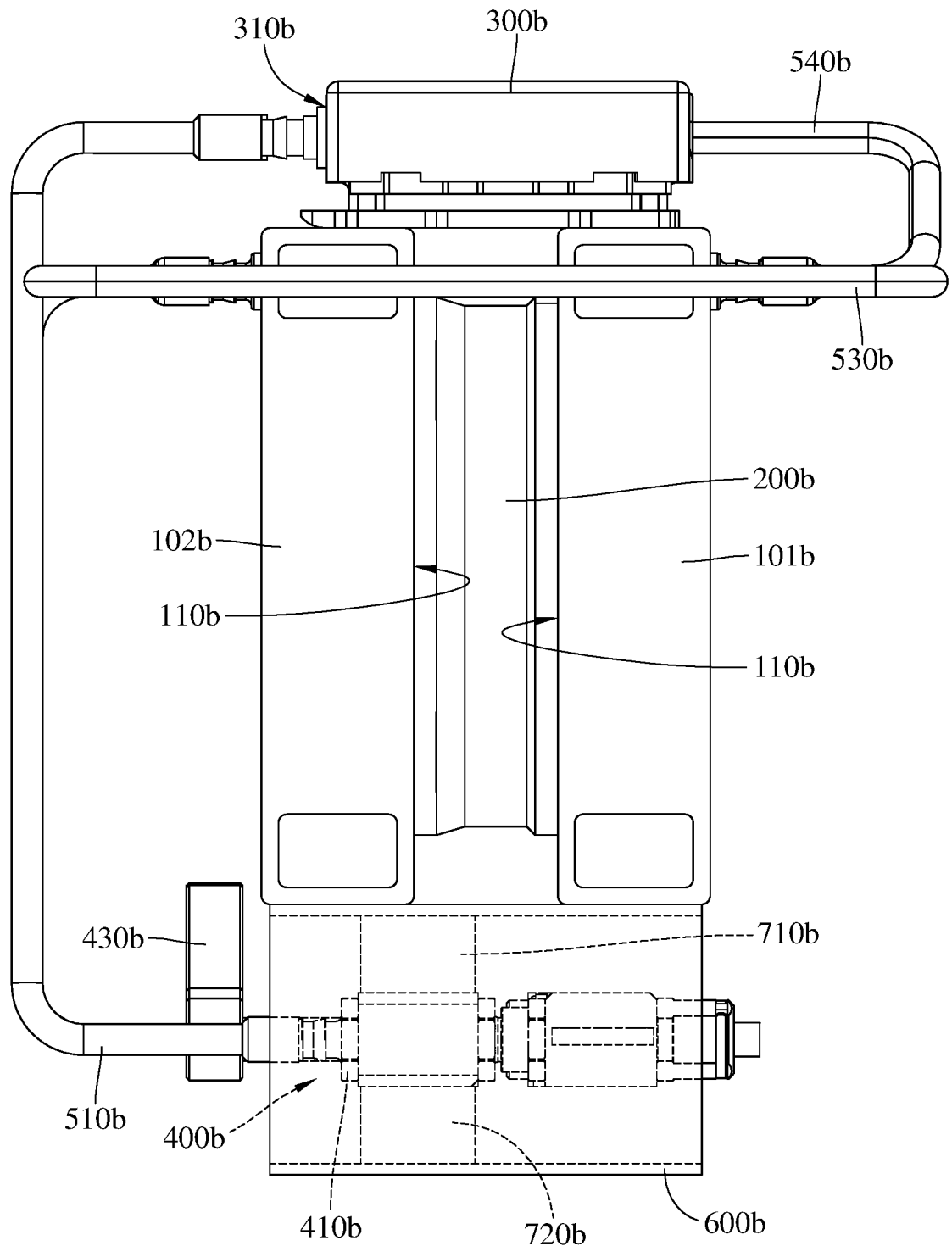
FIG. 6 is a side view of the external liquid cooling device in FIG. 4.

Please refer to FIG. 4 to FIG. 6, FIG. 4 is a perspective view of an external liquid cooling device according to a second embodiment of the present disclosure, FIG. 5 is a front view of the external liquid cooling device in FIG. 4, and FIG. 6 is a side view of the external liquid cooling device in FIG. 4.

This embodiment provides an external liquid cooling device 10b. The external liquid cooling device 10b may be a portable electronic device configured for cooling a notebook computer. The external liquid cooling device 10b include two radiators 101b and 102b, an airflow generator 200b, a water block 300b and a mount head module 400b.

Each of the two radiators 101b and 102b has a heat dissipation surface 110b, a first contact surface 120b and a second contact surface 130b. The heat dissipation surfaces 110b of the radiators 101b and 102b are located opposite to each other. The first contact surface 120b and the second contact surface 130b are located opposite to each other and are respectively connected to two opposite sides of the heat dissipation surface 110b.

The airflow generator 200b is, for example, an axial fan, and the airflow generator 200b is located between the radiators 101b and 102b. The airflow generator 200b can generate airflow to the heat dissipation surfaces 110b of the radiators 101b and 102b so as to dissipate the heat from the radiators 101b and 102b.

The water block 300b is disposed on the first contact surfaces 120b of the radiators 101b and 102b. That is, the water block 300b and the airflow generator 200b are respectively located at adjacent sides of the radiators 101b and 102b.

The mount head module 400b is located at a side of the two radiators 101b and 102b away from the water block 300b. That is, the mount head module 400b and the water block 300b are respectively located at two opposite sides of the two radiators 101b and 102b.

In addition, the mount head module 400b includes two connectors 410b and 420b which are respectively connected to the water block 300b and one of the two radiators 101b and 102b via piping. In detail, the water block 300b may further have an inlet 310b and an outlet 320b, the radiators 101b and 102b may each further have an inlet 140b and an outlet 150b, and the external liquid cooling device 10b may further include a first pipe 510b, a second pipe 520b, a third pipe 530b and a fourth pipe 540b. The connector 410b is connected to the inlet 310b of the water block 300b via the first pipe 510b, and the connector 420b is connected to the outlet 150b of the radiator 102b via the second pipe 520b. The inlet 140b of the radiator 102b is connected to the outlet 150b of the radiator 101b via the third pipe 530b, and the inlet 140b of the radiator 101b is connected to the outlet 320b of the water block 300b via the fourth pipe 540b.

In this embodiment, the external liquid cooling device 10b may further include a frame 600b and two elastic components 710b and 720b. The frame 600b is disposed on the second contact surfaces 130b of the radiators 101b and 102b. The elastic components 710b and 720b are respectively connected to two opposite sides of the mount head module 400b which is disposed at the frame 600b via the two elastic components 710b and 720b. In such a case, the frame 600b surrounds the mount head module 400b and the elastic components 710b and 720b.

In this embodiment, the mount head module 400b may further include an auxiliary component 430b configured to assist in connecting the connectors 410b and 420b to another two connectors (not shown in figures) of a notebook computer (not shown in figures). The elastic components 710b and 720b are configured to be compressed so that the two connectors 410b and 420b of the external liquid cooling device 10b is able to be aligned to the two connectors of the notebook computer; thus the two connectors 410b and 420b of the external liquid cooling device 10b is convenient for connecting to the two connectors of the notebook computer.

According to the external liquid cooling device discussed above, the water block and the mount head module are respectively disposed at two opposite sides of the radiator. Therefore, the external liquid cooling device has a smaller volume. Accordingly, the external liquid cooling device not only can cool the notebook computer but also is easily portable.

Furthermore, the mount head module is disposed at the frame via the elastic component, and the elastic component is configured to be compressed so that the two connectors of the external liquid cooling device is able to aligned to the two connectors of the notebook computer; thus the two connectors of the external liquid cooling device is convenient for connecting to the two connectors of the notebook computer.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. An external liquid cooling device, comprising:
two radiators;
at least one airflow generator;
a water block, wherein the at least one airflow generator and the water block are respectively disposed at two adjacent sides of the two radiators;
a mount head module, comprising two connectors, wherein each of the two connectors has a first end and a second end, the first ends of the two connectors being respectively connected to the water block and one of the two radiators via piping, the second ends of the two connectors being respectively configured to be connected to another two connectors of a notebook computer; and
a frame;
wherein the mount head module and the water block are respectively located at two opposite sides of the two radiators;
wherein the two radiators and the at least one airflow generator are located side by side between the water block and the mount head module, and the at least one airflow generator is located between the two radiators;
wherein the frame is disposed at a side of the two radiators away from the water block, and the mount head module is disposed on the two radiators via the frame.

2. The external liquid cooling device according to claim 1, wherein the frame surrounds the mount head module.

3. The external liquid cooling device according to claim 2, further comprising at least one elastic component, wherein the mount head module is disposed on the frame via the at least one elastic component.

4. The external liquid cooling device according to claim 3, wherein a quantity of the at least one elastic component is two, and the two elastic components are respectively connected to two opposite sides of the mount head module.

5. An external liquid cooling device, comprising:
at least one radiator;
two airflow generators;
a water block, wherein the two airflow generators and the water block are respectively disposed at two adjacent sides of the at least one radiator;
a mount head module, comprising two connectors, wherein each of the two connectors has a first end and a second end, the first ends of the two connectors being respectively connected to the water block and the at least one radiator via piping, the second ends of the two connectors being respectively configured to be connected to another two connectors of a notebook computer; and
a frame;
wherein the mount head module and the water block are respectively located at two opposite sides of the at least one radiator;
wherein the two airflow generators and the at least one radiator are located side by side between the water block and the mount head module, and the at least one radiator is located between the two airflow generators;
wherein the frame comprises two engaging components and a connecting component, and the two engaging components are respectively connected to two opposite sides of the at least one radiator;
wherein the two engaging components each comprise a plurality of positioning components configured to position the two engaging components on the at least one radiator.

6. The external liquid cooling device according to claim 5, further comprising an elastic component, wherein the mount head module is disposed at a side of the connecting component of the frame away from the at least one radiator via the elastic component.

7. An external liquid cooling device, comprising:
at least one radiator;
two airflow generators;
a water block, wherein the two airflow generators and the water block are respectively disposed at two adjacent sides of the at least one radiator;
a mount head module, comprising two connectors, wherein each of the two connectors has a first end and a second end, the first ends of the two connectors being respectively connected to the water block and the at least one radiator via piping, the second ends of the two connectors being respectively configured to be connected to another two connectors of a notebook computer; and
a frame and at least two support components;
wherein the mount head module and the water block are respectively located at two opposite sides of the at least one radiator;
wherein the two airflow generators and the at least one radiator are located side by side between the water block and the mount head module, and the at least one radiator is located between the two airflow generators;
wherein the frame comprises two engaging components and a connecting component, and the two engaging components are respectively connected to two opposite sides of the at least one radiator;
wherein the two support components are respectively disposed on the two engaging components and protrude from a side of the connecting component away from the at least one radiator, and the mount head module is located between the two support components.

* * * * *